(12) United States Patent
Lin et al.

(10) Patent No.: US 10,629,554 B2
(45) Date of Patent: Apr. 21, 2020

(54) PACKAGE STRUCTURE AND MANUFACTURING METHOD THEREOF

(71) Applicant: Powertech Technology Inc., Hsinchu County (TW)

(72) Inventors: Nan-Chun Lin, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/952,261

(22) Filed: Apr. 13, 2018

(65) Prior Publication Data
US 2019/0319000 A1 Oct. 17, 2019

(51) Int. Cl.
| | |
|---|---|
| H01L 23/00 | (2006.01) |
| H01L 21/56 | (2006.01) |
| H01L 23/31 | (2006.01) |
| H01L 21/78 | (2006.01) |

(52) U.S. Cl.
CPC ............ *H01L 24/02* (2013.01); *H01L 21/565* (2013.01); *H01L 21/568* (2013.01); *H01L 23/3185* (2013.01); *H01L 24/13* (2013.01); *H01L 21/78* (2013.01); *H01L 2224/0226* (2013.01); *H01L 2224/0231* (2013.01); *H01L 2224/02245* (2013.01); *H01L 2224/02255* (2013.01); *H01L 2224/02379* (2013.01); *H01L 2224/02381* (2013.01); *H01L 2224/13024* (2013.01); *H01L 2924/1816* (2013.01)

(58) Field of Classification Search
CPC ..... H01L 24/02; H01L 23/3185; H01L 24/13; H01L 21/568; H01L 21/565

USPC .......................................................... 257/773
See application file for complete search history.

(56) References Cited

U.S. PATENT DOCUMENTS

| | | | | |
|---|---|---|---|---|
| 6,235,552 | B1 * | 5/2001 | Kwon ................. | H01L 23/3114 438/106 |
| 2012/0244664 | A1 | 9/2012 | Jin et al. | |
| 2015/0179570 | A1 * | 6/2015 | Marimuthu ......... | H01L 21/6835 257/774 |

(Continued)

FOREIGN PATENT DOCUMENTS

| | | |
|---|---|---|
| TW | 201320255 | 5/2013 |
| TW | 201725769 | 7/2017 |

OTHER PUBLICATIONS

"Office Action of Taiwan Counterpart Application," dated Aug. 30, 2019, p. 1-p. 7.

*Primary Examiner* — Bo Fan
(74) *Attorney, Agent, or Firm* — JCIPRNET

(57) ABSTRACT

A package structure includes a die, an encapsulant, a dam structure, and a redistribution structure. The die has an active surface and a rear surface opposite to the active surface. The encapsulant encapsulates sidewalls of the die. The encapsulant has a first surface and a second surface opposite to the first surface. The first surface is coplanar with the rear surface of the die. The second surface is located at a level height different from the active surface of the die. The dam structure is disposed on the active surface of the die. A top surface of the dam structure is substantially coplanar with the second surface of the encapsulant. The redistribution structure is over the encapsulant, the dam structure, and the die. The redistribution structure is electrically connected to the die.

7 Claims, 10 Drawing Sheets

(56) References Cited

U.S. PATENT DOCUMENTS

2015/0364456 A1 12/2015 Yu et al.
2016/0240508 A1* 8/2016 Hou .................... H01L 25/0652

* cited by examiner

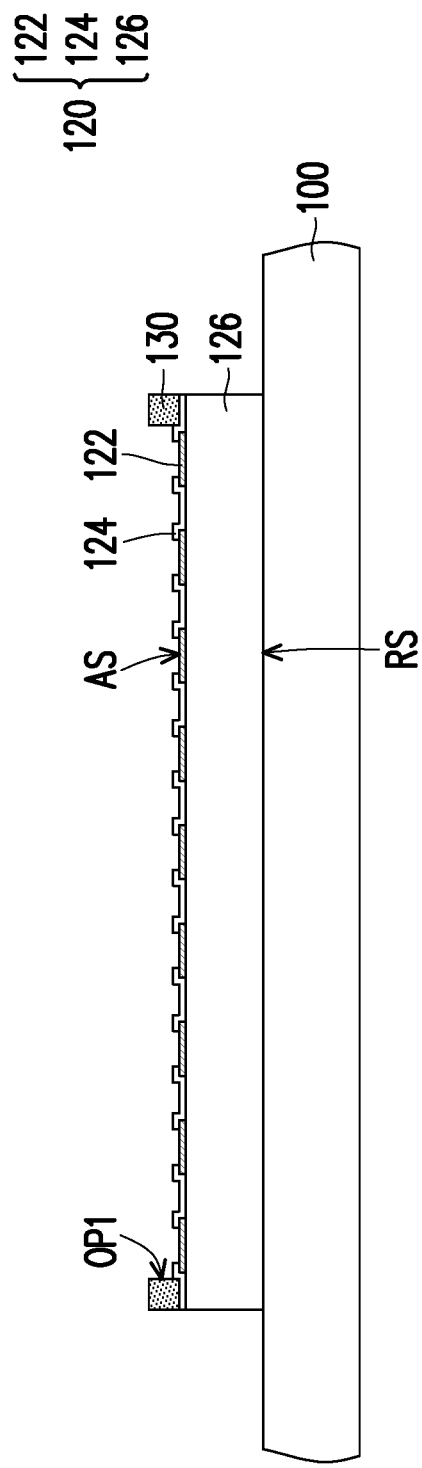
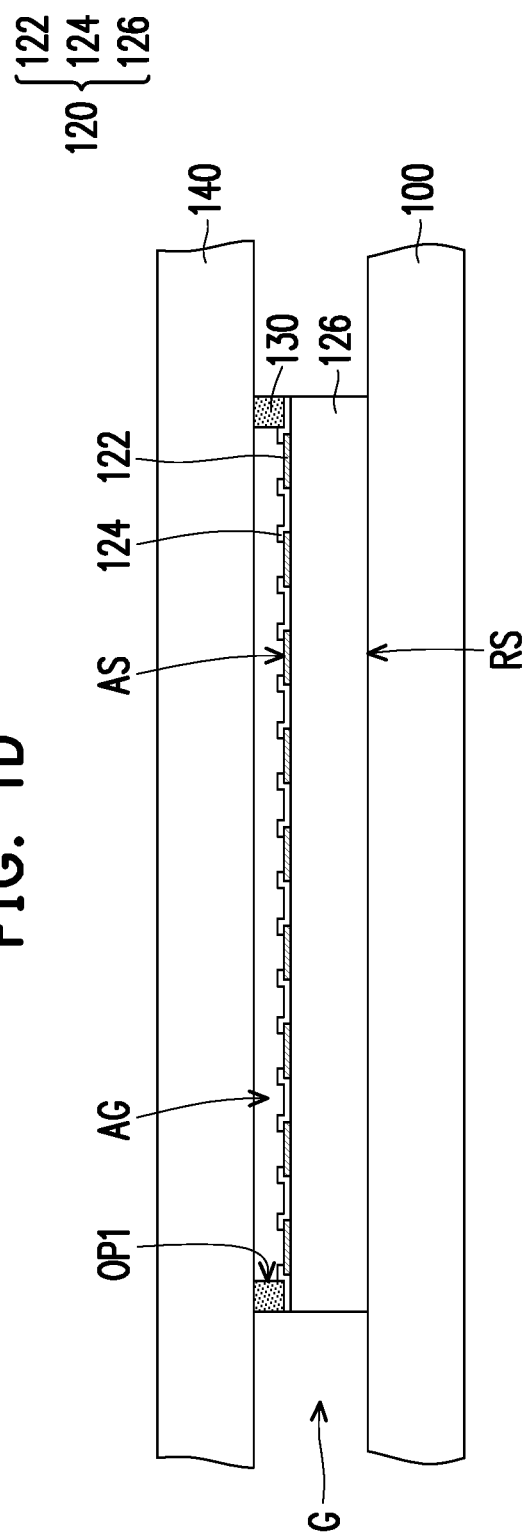
FIG. 1D
FIG. 1E

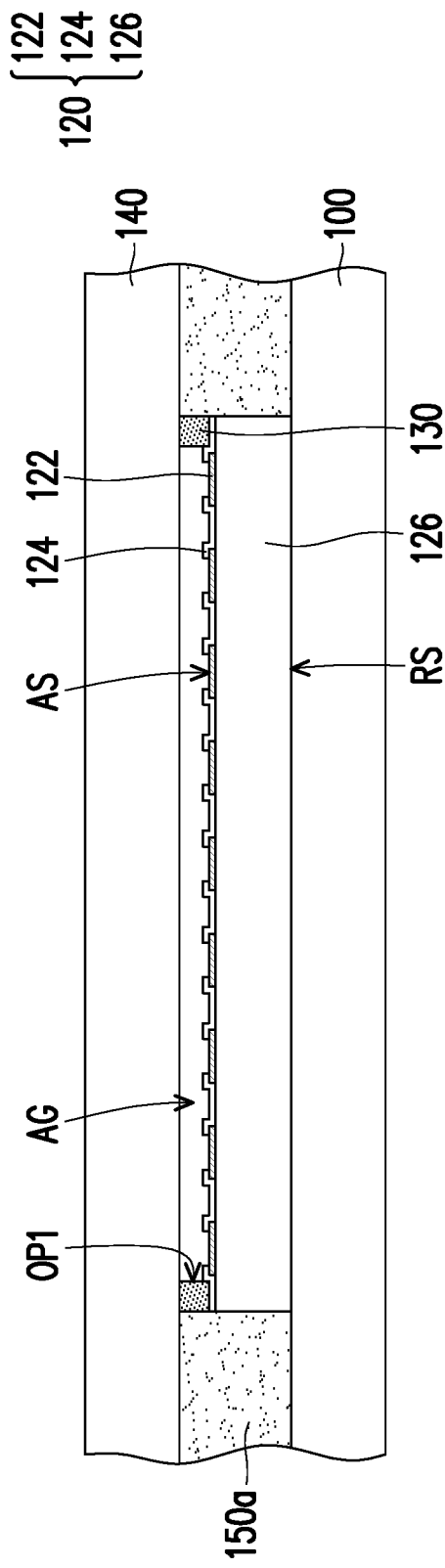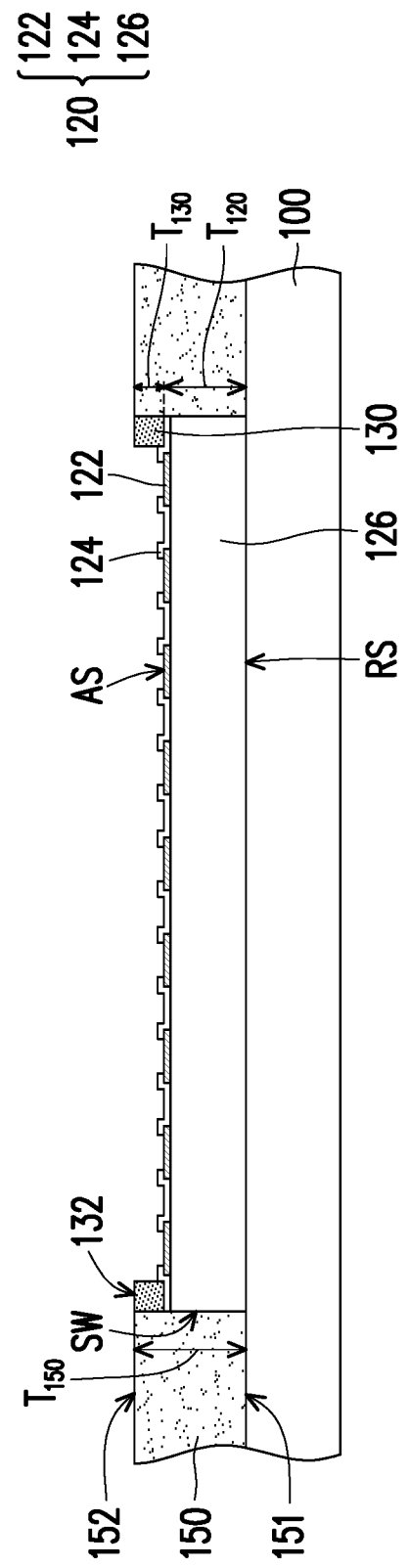

PACKAGE STRUCTURE AND MANUFACTURING METHOD THEREOF

BACKGROUND

Technical Field

The disclosure generally relates to a package structure and a manufacturing method thereof, and in particular, to a package structure having a dam structure and a manufacturing method thereof.

Description of Related Art

Semiconductor package technology has been progressed in recent years in order to develop products with smaller volume, lighter weight, higher integration level, and lower manufacturing cost. Nevertheless, the process complexity of the semiconductor packages becomes increasingly challenging as the dimension of the semiconductor packages decreases. Therefore, simplifying the manufacturing process of the package while maintaining the reliability thereof has become a challenge to researchers in the field.

SUMMARY

The disclosure provides a package structure and a manufacturing method thereof, which effectively enhances the reliability of the package structure at lower manufacturing cost.

The disclosure provides a package structure including a die, an encapsulant, a dam structure, and a redistribution structure. The die has an active surface and a rear surface opposite to the active surface. The encapsulant encapsulates sidewalls of the die. The encapsulant has a first surface and a second surface opposite to the first surface. The first surface is coplanar with the rear surface of the die. The second surface is located at a level height different from the active surface of the die. The dam structure is disposed on the active surface of the die. A top surface of the dam structure is substantially coplanar with the second surface of the encapsulant. The redistribution structure is over the encapsulant, the dam structure, and the die. The redistribution structure is electrically connected to the die.

The disclosure provides a manufacturing method of a package structure. The method includes at least the following steps. At least one die having a dam structure formed thereon is provided. The die has an active surface and a rear surface opposite to the active surface. The die includes a plurality of connection pads on the active surface. The dam structure is disposed on the active surface and exposes the connection pads. Thereafter, the die having the dam structure formed thereon is placed on a carrier. A mold chase is placed on the dame structure. An encapsulation material is filled into a gap between the mold chase and the carrier. Subsequently, the encapsulation material is cured to form an encapsulant encapsulating sidewalls of the die. A redistribution structure is formed over the encapsulant, the dam structure, and the active surface of the die. Then, the carrier is separated from the encapsulant and the die.

Based on the above, the die is encapsulated by adaption of a mold chase directly over the dam structure. As such, certain steps in the conventional molding process (for example, mold grinding process) or the conventional die forming process (for example, the formation of conductive bumps over connection pads of the die) may be skipped to reduce the process complexity and manufacturing cost of the package structure. Moreover, the transfer molding process using the mold chase and the dam structure forms an encapsulant with flat surfaces. As such, the redistribution structure may be formed on the flat surface of the encapsulant to alleviate the problem of breakage in conductive elements within the redistribution structure. Furthermore, since the dam structure is formed at edges of the die and is sandwiched between the die and the redistribution structure, the stress of the redistribution structure accumulated at edges of the die may be effectively reduced. As such, the reliability of the redistribution structure and the package structure may be ensured.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the invention.

FIG. 1A to FIG. 1J are schematic cross-sectional views illustrating a manufacturing method of a package structure according to some embodiments of the disclosure.

DESCRIPTION OF THE EMBODIMENTS

Figure 1A:
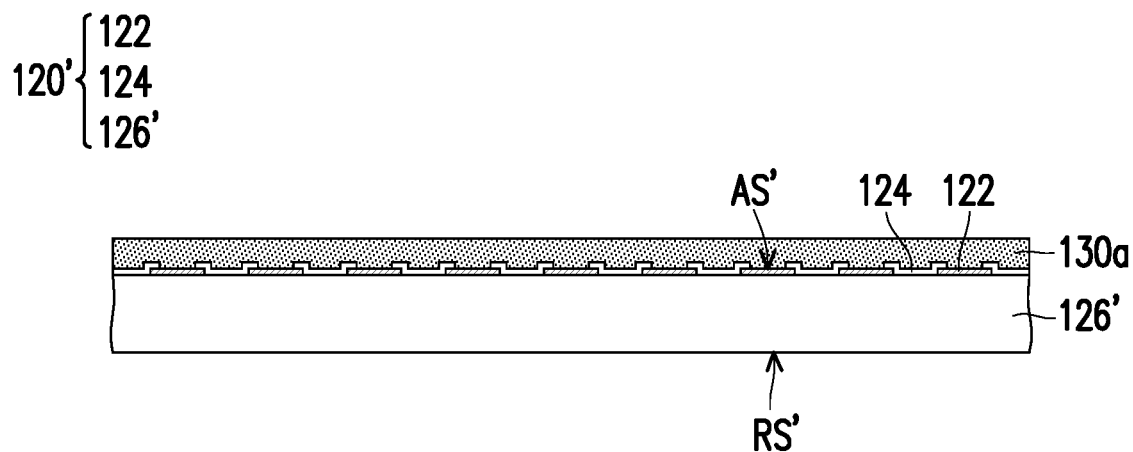

Reference will now be made in detail to the present preferred embodiments of the disclosure, examples of which are illustrated in the accompanying drawings. Wherever possible, the same reference numbers are used in the drawings and the description to refer to the same or like parts.

FIG. 1A to FIG. 1J are schematic cross-sectional views illustrating a manufacturing method of a package structure 10 according to some embodiments of the disclosure. Referring to FIG. 1A, a wafer 120' is provided. The wafer 120' includes a semiconductor substrate 126', a plurality of connection pads 122, and a passivation layer 124. The wafer 120' has an active surface AS' and a rear surface RS' opposite to the active surface AS', and the connection pads 122 are disposed on the active surface AS'. In some embodiments, the semiconductor substrate 126' may be a silicon substrate having active components and, optionally, passive components formed therein. Examples of the active components include transistor or the like. Examples of the passive components include resistors, capacitors, inductors, or the like. The connection pads 122 are distributed over the semiconductor substrate 126'. In some embodiments, the connection pads 122 may include aluminum pads, copper pads, or other suitable metal pads. The passivation layer 124 is formed over the semiconductor substrate 126' to cover a portion of each connection pad 122. The passivation layer 124 has a plurality of contact openings exposing another portion of each connection pad 122. In some embodiments, the passivation layer 124 may be made of polymeric materials. In some alternative embodiments, the passivation layer 124 may be a silicon oxide layer, a silicon nitride layer, a silicon oxy-nitride layer, or a dielectric layer formed by other suitable dielectric materials.

As illustrated in FIG. 1A, a dam material layer 130a is formed over the active surface AS' of the wafer 120'. The dam material layer 130a may be formed by suitable fabrication techniques such as spin-on coating, chemical vapor deposition (CVD), plasma-enhanced chemical vapor deposition (PECVD), or the like. The dam material layer 130a may completely cover the connection pads 122 and the passivation layer 124. In some embodiments, the dam material layer 130a may include photosensitive material, epoxy, polyimide, silicone based material, or a combination thereof. In some embodiments, the dam material layer 130a may have elasticity to function as a buffer layer for the subsequently formed components. For example, a Young's modulus of the dam material layer 130a may range between 0.5 GPa and 3 GPa.

Figure 1B:
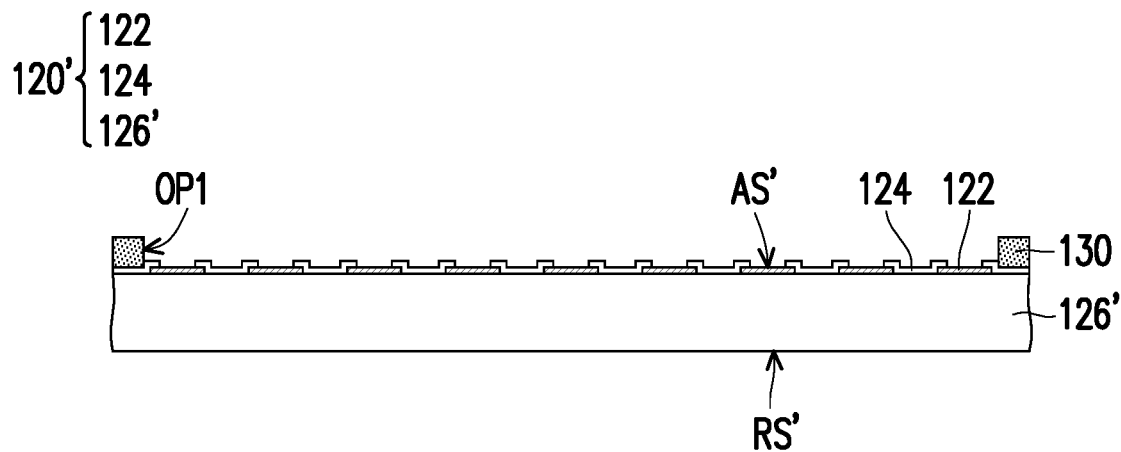

Referring to FIG. 1B, a portion of the dam material layer 130a is removed to form a dam structure 130 having at least one opening OP1. It should be noted that since only a portion of the wafer 126' is illustrated in FIG. 1B, only one of the openings OP1 is shown. The dam material layer 130a may be removed through, for example, a photolithography process followed by an etching process. In other words, the dam material layer 130a is patterned to form the dam structure 130. As illustrated in FIG. 1B, the opening OP1 exposes the connection pads 122. In some embodiments, the dam structure 130 extends over the scribe line and covers the scribe line.

Figure 1C:
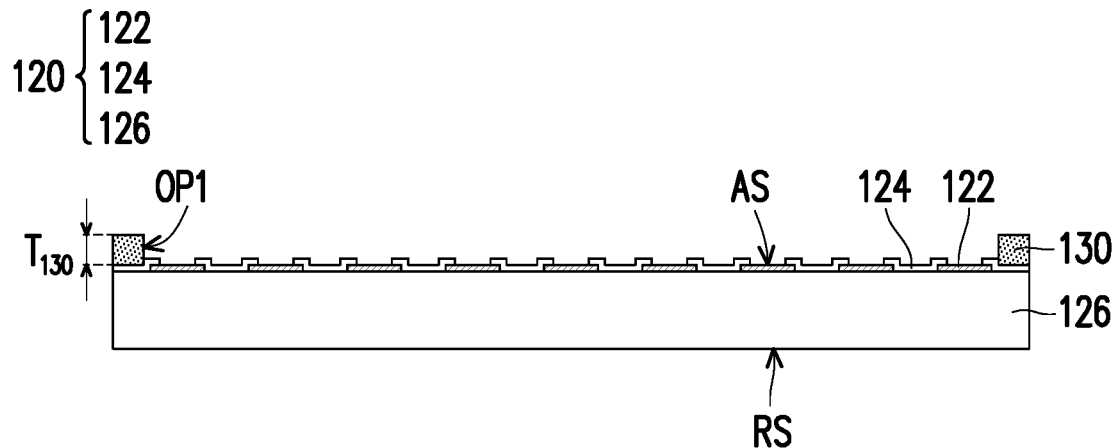
Figure 2:
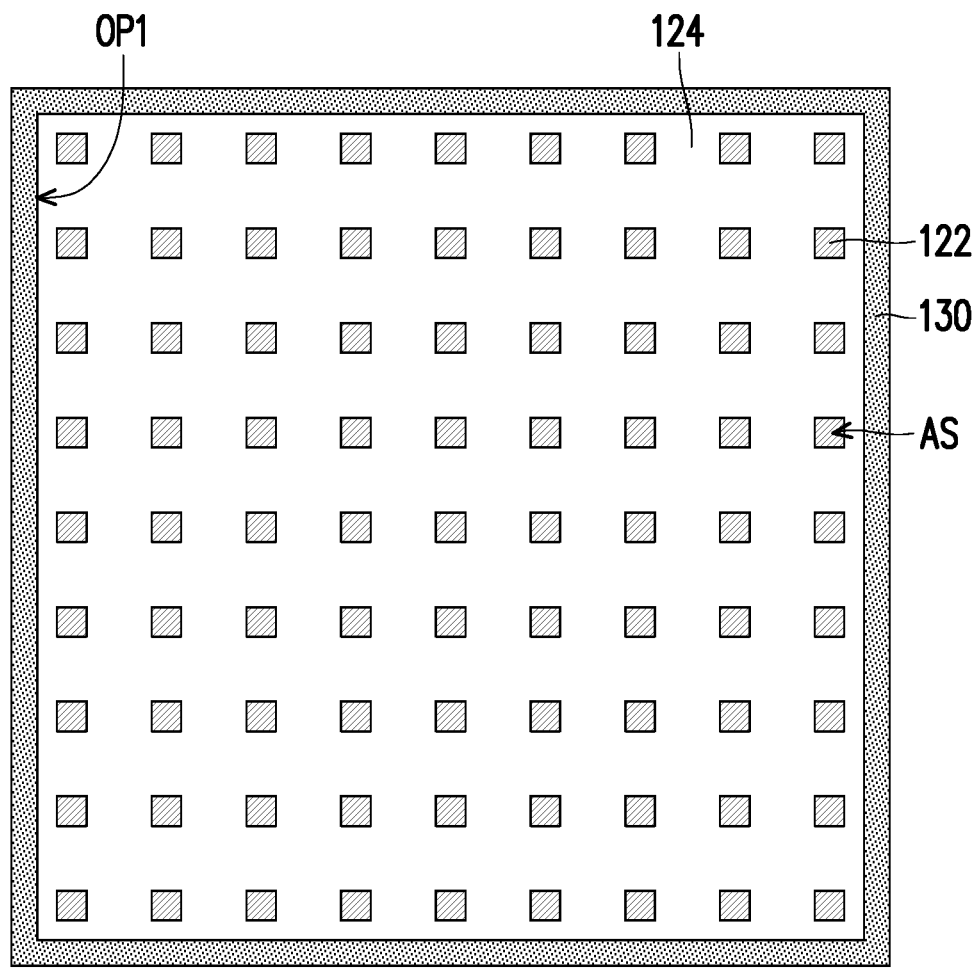
FIG. 2 is a schematic top view of the die and the dam structure in FIG. 1C.

Referring to FIG. 1C, the wafer 120' is diced to form a plurality of dies 120 having the dam structure 130 formed thereon. The wafer 120' may be diced or singulated through, for example, cutting with rotating blades or laser beams. In some embodiments, a thickness $T_{130}$ of the dam structure 130 ranges between 2 μm and 10 μm. FIG. 2 is a schematic top view of the die 120 and the dam structure 130 in FIG. 1C. The detailed descriptions with respect to the die 120 and the dam structure 130 will be presented below in conjunction with FIG. 2.

Referring to FIG. 1C and FIG. 2, each die 120 has an active surface AS and a rear surface RS opposite to the active surface AS. In some embodiments, each die 120 includes a semiconductor substrate 126, the connection pads 122, and the passivation layer 124. The connection pads 122 are disposed on the active surface AS of the die 120. On the other hand, the dam structure 130 is disposed on the active surface AS of the die 120. As illustrated in FIG. 1C and FIG. 2, the dam structure 130 takes the form of a ring pattern disposed along edges of the active surface AS within the die 120. For example, the dam structure 130 has one single opening OP1 exposing a central region of the active surface AS of the die 120. In some embodiments, since the connection pads 122 are disposed on the active surface AS of the die 120, the opening OP1 of the dam structure 130 exposes multiple connection pads 122 simultaneously. It should be noted that although FIG. 2 depicted the dam structure 130 as a squared ring pattern, the disclosure is not limited thereto. In some alternative embodiments, the dam structure 130 may be a circular ring pattern, a triangular ring pattern, or ring patterns with any other geometry. Moreover, in some alternative embodiments, the dam structure 130 may be a mesh pattern instead of a ring pattern. For example, other exemplary embodiment of the dam structure 130 will be discussed below in conjunction with FIG. 3 and FIG. 4.

Figure 3:
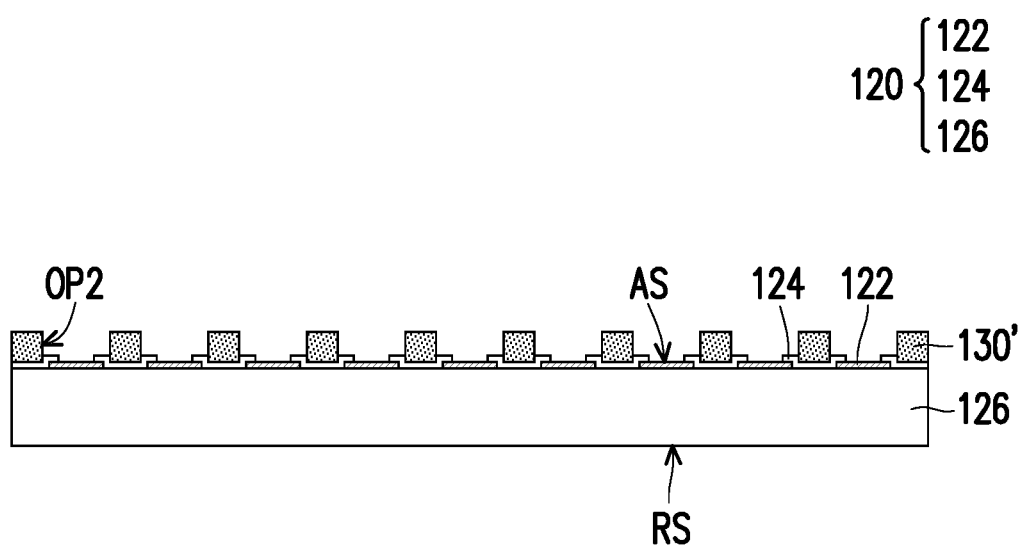
FIG. 3 is a schematic cross-sectional view illustrating an intermediate step of a manufacturing method of a package structure according to some alternative embodiments of the disclosure.
Figure 4:
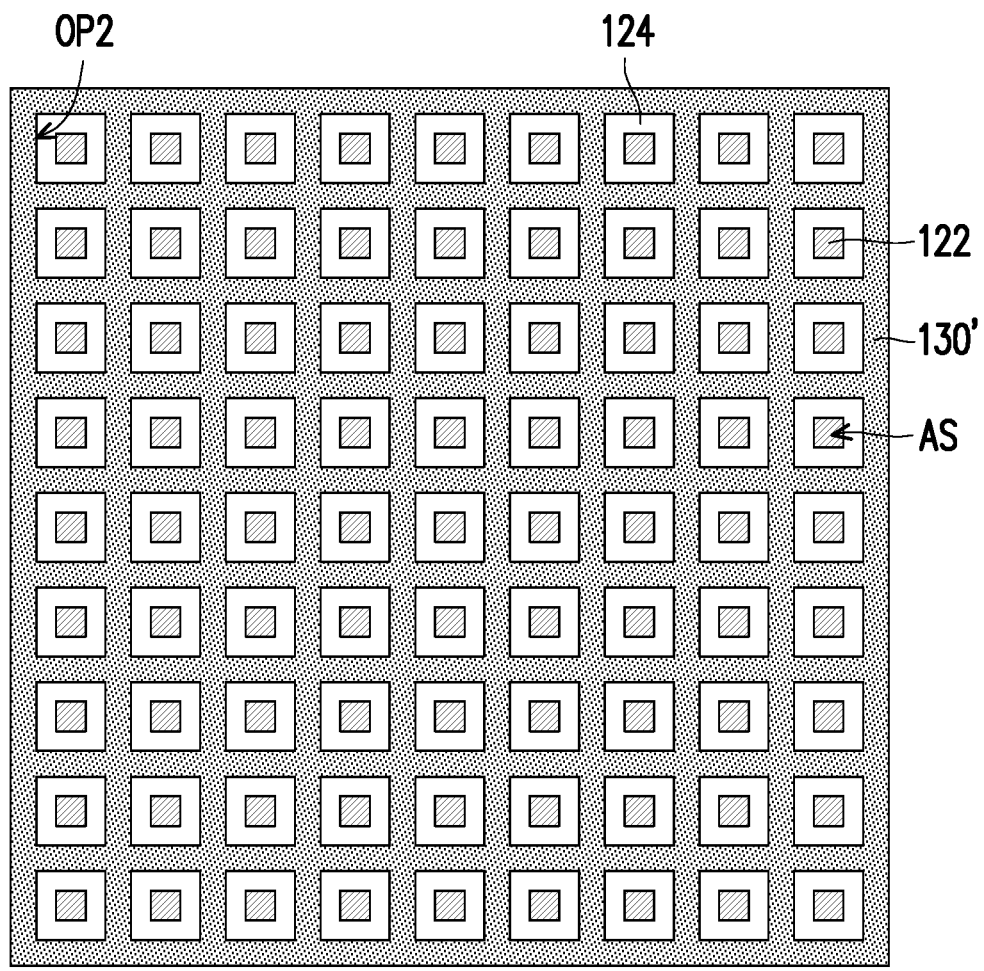
FIG. 4 is a schematic top view of the die and the dam structure in FIG. 3.

FIG. 3 is a schematic cross-sectional view illustrating an intermediate step of a manufacturing method of a package structure 10 according to some alternative embodiments of the disclosure. FIG. 4 is a schematic top view of the die 120 and the dam structure 130' in FIG. 3. Referring to FIG. 3 and FIG. 4, the dam structure 130' takes the form of a mesh pattern. For example, the dam structure 130 has a plurality of openings OP2. Each opening OP2 exposes the corresponding connection pad 122. In some embodiments, the dam structure 130' is formed to surround each connection pad 122, and each opening OP2 of the dam structure 130' exposes the corresponding connection pad 122 in a one-to-one manner. In some embodiments, the mesh pattern may increase the contact area between dam structure 130' and the subsequently formed components. As such, the subsequently formed component may be stably placed on the dam structure 130' so that the process simplicity and reliability may be realized.

Referring back to FIG. 1D, a carrier 100 is provided. The die 120 having the dam structure 130 formed thereon (the structure illustrated in FIG. 1C) is placed on the carrier 100. In some embodiments, multiple dies 120 may be placed on the carrier 100. For simplicity, one die 120 is illustrated in FIG. 1D. As illustrated in FIG. 1D, the die 120 is placed such that the active surface AS faces upward. In some embodiments, the rear surface RS of the die 120 is attached to the carrier 100. The carrier 100 may be made of glass, silicon, plastic, or other suitable materials. However, the disclosure is not limited thereto. Other suitable substrate material may be adapted as the carrier 100 as long the material is able to withstand the subsequent processes while carrying the package structure formed thereon. In some embodiments, a die attach film (DAF; not shown) and/or a de-bonding layer (not shown) may be disposed between the die 120 and the carrier 100. The DAF may be disposed between the die 120 and the carrier 100 to enhance the adhesion between the two. The de-bonding layer is formed over the carrier 100 to temporarily enhance the adhesion between the carrier 100 and the die 120. The de-bonding layer may be a light to heat conversion (LTHC) adhesive layer or other suitable adhesive layers.

Referring to FIG. 1E, a mold chase 140 is placed on the dam structure 130. The dam structure 130 may be considered to be protruded from the die 120. As such, the mold chase 140 is placed over the die in an elevated manner. For example, the mold chase 140 may seal the opening OP1 of the dam structure 130 to create an air gap AG above the connection pads 122. For example, the air gap AG is being tightly sealed among the passivation layer 124 of the die 120, the connection pads 122 of the die 120, the dam structure 130, and the mold chase 140. On the other hand, a gap G is formed between the mold chase 140 and the carrier 100. In some embodiments, the mold chase 140 may be made of metallic materials having strong heat resistance. In some embodiments, the mold chase 140 may be made of materials able to withstand high temperature for the subsequent molding process. For example, a material of the mold chase 140 may include steel or the like.

Referring to FIG. 1F, an encapsulation material 150a is filled into the gap G. The encapsulation material 150a may be a molding compound including polymers, epoxy, or other suitable resins. The encapsulation material 150a may be in solid form at room temperature. In some embodiments, the encapsulation material 150a is first melted. Subsequently, the encapsulation material 150a is pumped into the gap G.

In some embodiments, the encapsulation material 150a is pumped into the gap G along a direction parallel to the rear surface RS of the die 120. In some embodiments, the foregoing process may be referred to as a transfer molding process. During the transfer molding process, a clamp force may be applied to the mold chase 140 such that mold chase 140 is firmly pressed against the dam structure 130. As mentioned above, the air gap AG above the connection pads 122 is tightly sealed among the passivation layer 124 of the die 120, the connection pads 122 of the die 120, the dam structure 130, and the mold chase 140. Therefore, the dam structure 130 may block the encapsulation material 150a from flowing into the air gap AG and damaging the connection pads 122 during the transfer molding process. For example, during the transfer molding process, the active surface AS of the die 120 is free from the encapsulation material 150a. As such, the electrical connection between the connection pads 122 and the subsequently formed elements may be ensured and the reliability of the subsequently formed package structure 10 may be enhanced. In some embodiments, a Young's modulus of the encapsulation material 150a ranges between 10 GPa and 20 GPa. As illustrated in FIG. 1F, the mold chase 140 is directly in contact with the dam structure 130 and the encapsulation material 150a. However, the disclosure is not limited thereto. Other exemplary embodiment of the mold chase 140 will be discussed below in conjunction with FIG. 5.

Figure 5:
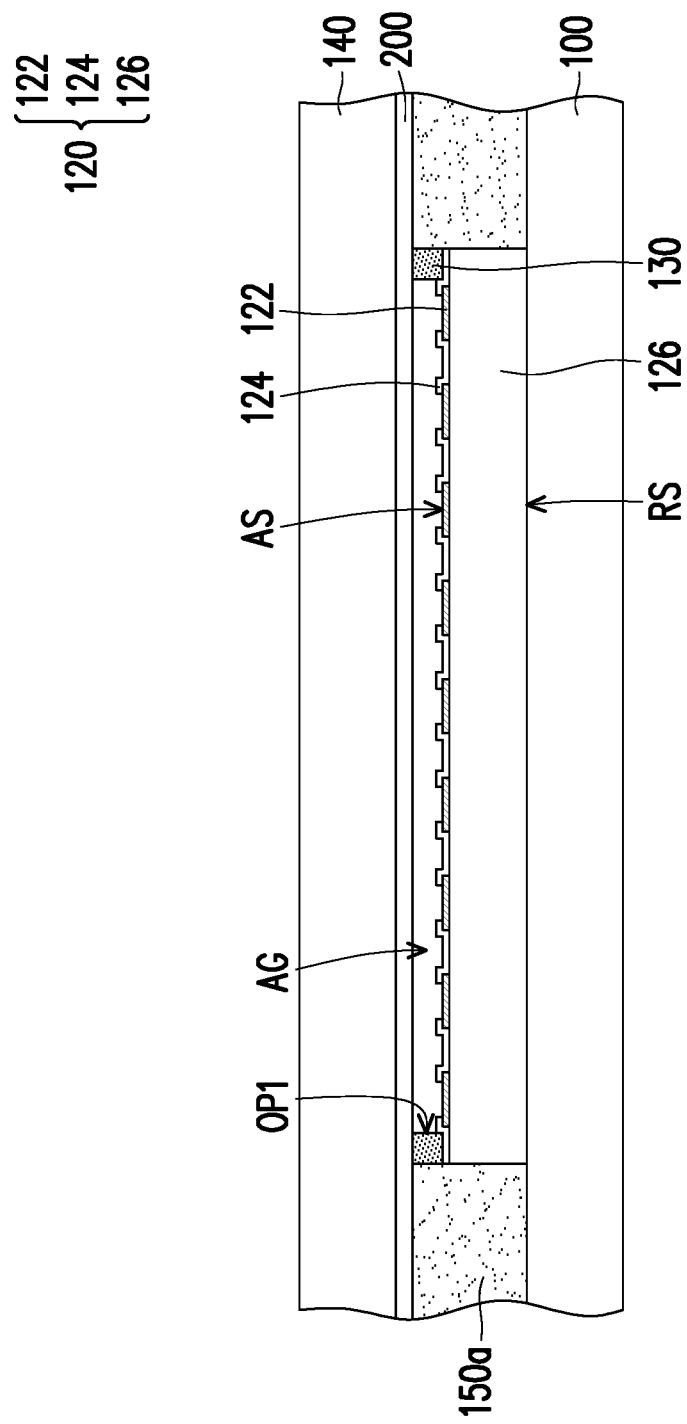
FIG. 5 is a schematic cross-sectional view illustrating an intermediate step of a manufacturing method of a package structure according to some alternative embodiments of the disclosure.

FIG. 5 is a schematic cross-sectional view illustrating an intermediate step of a manufacturing method of a package structure 10 according to some alternative embodiments of the disclosure. Referring to FIG. 5, a sealing film 200 may be attached on the mold chase 140 prior to placing the mold chase 140 on the dam structure 130. In some embodiments, the sealing film 200 may be a polyethylene terephthalate (PET) film, a high temperature resistance film, or a removable film (such as a releasing layer). For example, a material of the sealing film 200 may include thermostable epoxy resin, polyethylene terephthalate (PET), high temperature resistance materials, light-to-heat conversion (LTHC) material, or a combination thereof. The sealing film 200 may have elasticity. Furthermore, the sealing film 200 may be easily peeled off from the dam structure 130 and the encapsulation material 150a. For example, a Young's modulus of the sealing film 200 may be less than 1 GPa. As illustrated in FIG. 5, the sealing film 200 is directly in contact with the dam structure 130 and the encapsulation material 150a. The sealing film 200 may seal the opening OP1 of the dam structure 130 to create an air gap AG above the connection pads 122. For example, the air gap AG is being tightly sealed among the passivation layer 124 of the die 120, the connection pads 122 of the die 120, the dam structure 130, and the sealing film 200. By adapting the sealing film 200, the risk of molding penetration (a scenario where the encapsulation material 150a flows into the air gap AG) may be further reduced to ensure the reliability of the subsequently formed package structure 10.

Referring back to FIG. 1G, the mold chase 140 is removed and the encapsulation material 150a is cured to form an encapsulant 150. In some embodiments, the curing temperature may range between 130° C. and 150° C. The encapsulant 150 encapsulates sidewalls SW of a die 120. The encapsulant 150 has a first surface 151 and a second surface 152 opposite to the first surface 151. Since the encapsulant 150 is formed to fill the gap G (shown in FIG. 1E), the first surface 151 of the encapsulant 150 is coplanar with the rear surface RS of the die 120 while the second surface 152 of the encapsulant 150 is substantially coplanar with a top surface 132 of the dam structure 130. In some embodiments, both of the first surface 151 and the second surface 152 of the encapsulant 150 are flat surfaces with little or no roughness. For example, a roughness of the first surface 151 and the second surface 152 ranges between 0 μm and 0.2 μm. In some embodiments, the second surface 152 of the encapsulant 150 is located at a level height different from the active surface AS of the die 120. For example, as illustrated in FIG. 1G, the second surface 152 of the encapsulant 150 is located at a level height higher than the active surface AS of the die 120. In some embodiments, a thickness $T_{150}$ of the encapsulant 150 is larger than a thickness $T_{120}$ of the die 120. In some embodiments, the thickness $T_{150}$ of the encapsulant 150 may range between 50 μm and 500 μm while the thickness $T_{120}$ of the die 120 may range between 40 μm and 498 μm. On the other hand, a sum of the thickness $T_{120}$ of the die 120 and the thickness $T_{130}$ of the dam structure 130 may be equal to the thickness $T_{150}$ of the encapsulant 150. It should be noted that since a thickness of the passivation layer 124 of the die 120 is negligible, the thickness $T_{120}$ of the die 120 herein is defined as a sum of a thickness of the semiconductor substrate 126 and a thickness of the connection pads 122.

Figure 1H:
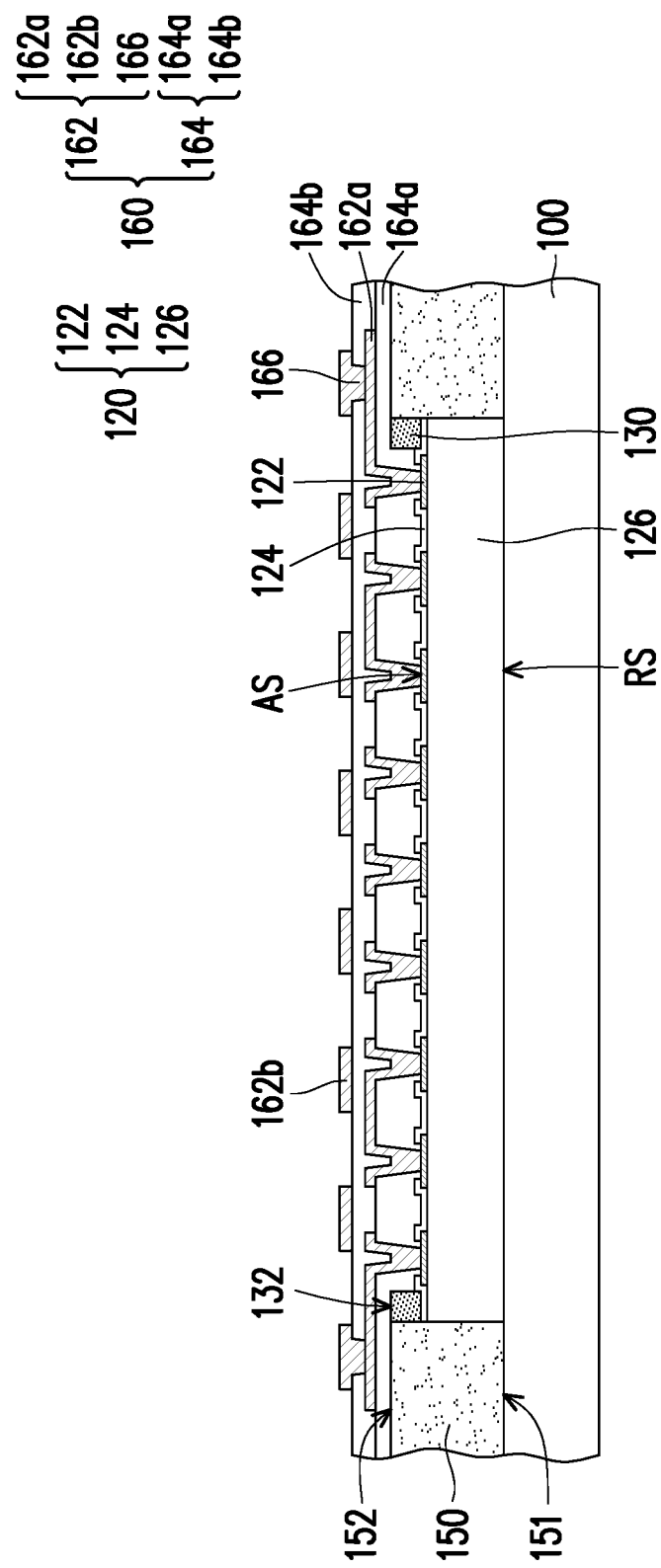

Referring to FIG. 1H, a redistribution structure 160 is formed over the encapsulant 150, the dam structure 130, and the active surface AS of the die 120. The redistribution structure 160 is electrically connected to the connection pads 122 of the die 120. The redistribution structure 160 may include at least one dielectric layer 164 and a plurality of conductive elements 162 embedded in the dielectric layer 164. In some embodiments, the dielectric layers 164 may be formed by suitable fabrication techniques such as spin-on coating, chemical vapor deposition (CVD), plasma-enhanced chemical vapor deposition (PECVD), or the like. The dielectric layers 164 may be made of non-organic or organic dielectric materials such as silicon oxide, silicon nitride, silicon carbide, silicon oxynitride, polyimide, benzocyclobutene (BCB), or the like. On the other hand, the conductive elements 162 may be formed by sputtering, evaporation, electro-less plating, or electroplating. The conductive elements 162 may be made of copper, aluminum, nickel, gold, silver, tin, a combination thereof, or other suitable conductive materials. As illustrated in FIG. 1H, the redistribution structure 160 includes two dielectric layers (a first dielectric layer 164a and a second dielectric layer 164b). However, the number of the dielectric layer 164 is not limited and may be adjusted based on circuit design. The conductive elements 162 may include a plurality of trace layers (a first trace layer 162a and a second trace layer 162b) and a plurality of interconnect structures 166 connecting the trace first layer 162a and the second trace layer 162b. The first dielectric layer 164a is disposed on the encapsulant 150, the dam structure 130, and the active surface AS of the die 120. In some embodiments, the first dielectric layer 164a has a non-uniform thickness. For example, a thickness of the first dielectric layer 164a directly above the active surface AS of the die 120 is larger than a thickness of the first dielectric layer 164a directly above the second surface 152 of the encapsulant 150 and the top surface 132 of the dam structure 130. The first dielectric layer 164a has a plurality of contact openings exposing the connection pads 122. The first trace layer 162a extends into the contact opening to be directly in contact with the connection pads 122, so electrical connection between the die 120 and the redistribution structure 160 may be realized. For example, the redistribution structure 160 is directly in contact with the connection pads 122 of the die 120. The second dielectric layer 164b covers the first trace layer 162a. Similar to the first dielectric layer 164a, the second dielectric layer 164b also has a plurality of contact openings exposing part of the first trace layer 162a such that the first trace layer 162a may be electrically connected to other trace layers (for example, the second trace layer 162b) through the interconnect structures 166. The second trace layer 162b is electrically connected to at least part of the first trace layer 162a exposed by the second dielectric layer 164b. The second trace layer 162b may be used for electrical connection with elements formed in the subsequent processes. In some embodiments, the second trace layer 162b may be referred to as under-bump metallization (UBM).

As mentioned above, the second surface 152 of the encapsulant 150 is substantially coplanar with the top surface 132 of the dam structure 130 while being a flat surface. As such, the redistribution structure 160 may be formed on the flat surface to alleviate the problem of breakage in conductive elements 162 within the redistribution structure 160. Furthermore, since the dam structure 130 is formed at edges of the die 120 and is sandwiched between the die 120 and the redistribution structure 160, the stress of the redistribution structure 160 accumulated at edges of the die 120 may be effectively reduced. As such, the reliability of the redistribution structure 160 may be ensured.

Figure 1I:
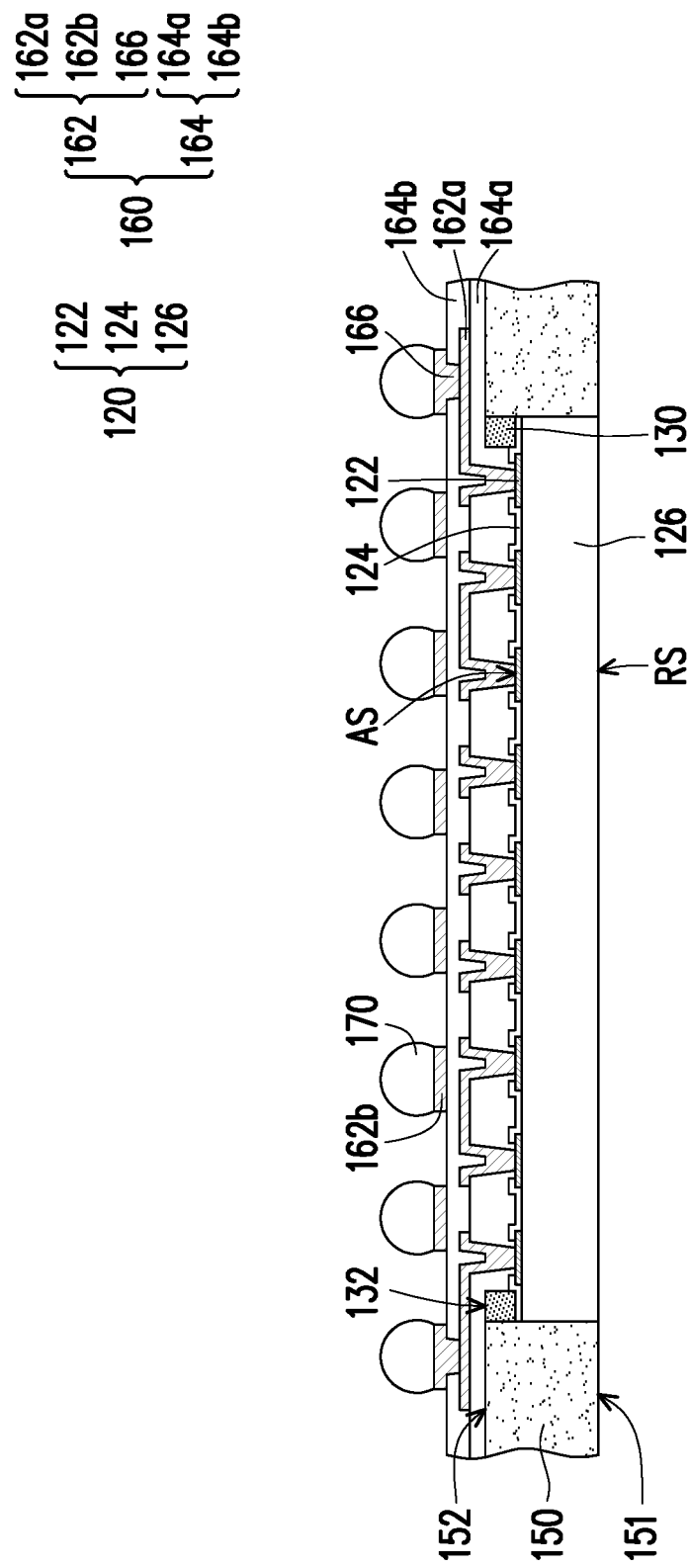

Referring to FIG. 1I, the carrier 100 is separated from the first surface 151 of the encapsulant 150 and the rear surface RS of the die 120. As mentioned above, a de-bonding layer (an LTHC layer; not shown) may be disposed between the carrier 100 and the die 120. Upon irradiation with an UV laser, the de-bonding layer and the carrier 100 may be peeled off and separated from the die 120 and the encapsulant 150. Upon removal of the carrier 100, the first surface 151 of the encapsulant 150 and the rear surface RS of the die 120 are exposed. For example, the rear surface RS of the die 120 is exposed by the encapsulant 150. As illustrated in FIG. 1I, a plurality of conductive terminals 170 are formed over the redistribution structure 160. The conductive terminals 170 may be formed by, for example, a ball placement process and a reflow process. In some embodiments, the conductive terminals 170 are disposed on the second trace layer 162b. In some embodiments, the conductive terminals 170 are conductive bumps such as solder balls. However, the disclosure is not limited thereto. Other possible forms and shapes of the conductive terminals 170 may be utilized. For example, the conductive terminals 170 may take the form of conductive pillars or conductive posts in some alternative embodiments. In some embodiments, the step of separating the carrier 100 from the encapsulant 150 and the die 120 precedes the step of forming the conductive terminals 170. However, it construes no limitation in the disclosure. In some alternative embodiments, these two steps may be reversed. Namely, the step of forming the conductive terminals 170 may precede the step of separating the carrier 100 from the encapsulant 150 and the die 120.

Figure 1J:
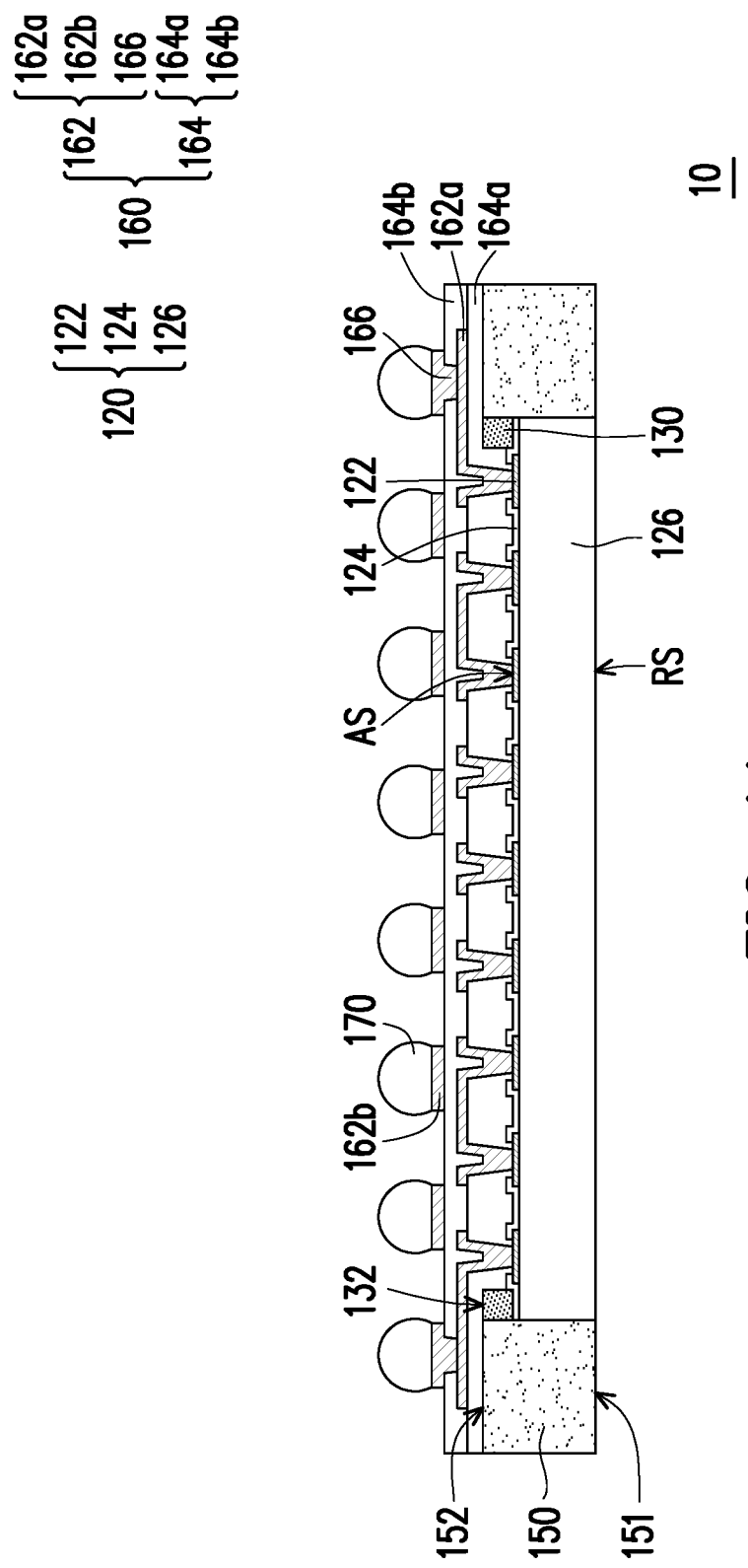

Referring to FIG. 1J, a singulation process is performed on the structure illustrated in FIG. 1I to obtain a plurality of package structures 10. The singulation process includes, for example, cutting with rotating blades or laser beams.

In the light of the foregoing, the die is encapsulated by adaption of a mold chase directly over the dam structure. As such, certain steps in the conventional molding process (for example, mold grinding process) or the conventional die forming process (for example, the formation of conductive bumps over connection pads of the die) may be skipped to reduce the process complexity and manufacturing cost of the package structure. Moreover, the transfer molding process using the mold chase and the dam structure forms an encapsulant with flat surfaces. As such, the redistribution structure may be formed on the flat surface of the encapsulant to alleviate the problem of breakage in conductive elements within the redistribution structure. Furthermore, since the dam structure is formed at edges of the die and is sandwiched between the die and the redistribution structure, the stress of the redistribution structure accumulated at edges of the die may be effectively reduced. As such, the reliability of the redistribution structure and the package structure may be ensured.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents

What is claimed is:

1. A package structure, comprising:
    a die having an active surface and a rear surface opposite to the active surface;
    an encapsulant encapsulating sidewalls of the die, wherein the encapsulant has a first surface and a second surface opposite to the first surface, the first surface is coplanar with the rear surface of the die, and the second surface is located at a level height different from the active surface of the die;
    a dam structure disposed on the active surface of the die, wherein a top surface of the dam structure is substantially coplanar with the second surface of the encapsulant; and
    a redistribution structure over the encapsulant, the dam structure, and the die, wherein the redistribution structure is electrically connected to the die,
    wherein the dam structure is spaced apart from a conductive element of the redistribution structure, the die comprises a plurality of connection pads and the dam structure comprises at least one opening, and the at least one opening exposes the plurality of connection pads, and the dam structure comprises a ring pattern having one opening, the ring pattern is disposed along edges of the active surface within the die, and the one opening exposes the plurality of connection pads.

2. The package structure according to claim 1, further comprising a plurality of conductive terminals over the redistribution structure.

3. The package structure according to claim 1, wherein a thickness of the encapsulant is larger than a thickness of the die.

4. The package structure according to claim 1, wherein a sum of a thickness of the die and a thickness of the dam structure is equal to a thickness of the encapsulant.

5. The package structure according to claim 1, wherein the redistribution structure is directly in contact with the plurality of connection pads.

6. The package structure according to claim 1, wherein a material of the dam structure comprises photosensitive material, epoxy, polyimide, silicone based material, or a combination thereof.

7. The package structure according to claim 1, wherein the rear surface of the die is exposed by the encapsulant.

* * * * *